United States Patent [19]

Kessler

[11] 4,061,928

[45] Dec. 6, 1977

[54] CIRCUIT ARRANGEMENT FOR THE PROTECTION OF INPUTS OF INTEGRATED MOS CIRCUITS

[75] Inventor: Heinrich Hubert Kessler, Munich, Germany

[73] Assignee: Siemens Aktiengesellschaft, Berlin & Munich, Germany

[21] Appl. No.: 717,704

[22] Filed: Aug. 25, 1976

[30] Foreign Application Priority Data

Sept. 8, 1975 Germany .................. 2539890

[51] Int. Cl.$^2$ .................. H02H 9/04; H03K 3/353
[52] U.S. Cl. .................. 307/200 B; 307/304; 330/207 P; 361/56
[58] Field of Search .................. 307/202 R, 205, 304, 307/251; 330/207 P; 317/16, 33 R, 33 SC, 31

[56] References Cited

U.S. PATENT DOCUMENTS

| 3,395,290 | 7/1968 | Farina et al. | 307/205 X |
| 3,676,742 | 7/1972 | Russell et al. | 317/33 R |
| 3,712,995 | 1/1973 | Steudel | 307/304 |
| 3,947,727 | 3/1976 | Stewart | 317/33 V |
| 3,967,295 | 6/1976 | Stewart | 307/304 X |

OTHER PUBLICATIONS

Lenzlinger, "Gate Protection of MIS Devices"; IEEE Trans. on Electron Devices; vol. ED-18, No. 4, pp. 249-257; 4/1971.
Fischer, "Resistor-Thick Oxide FET Gate Protection Device for Thin Oxide FET"; IBM Tech. Discl. Bull.; vol. 13, No. 5, pp. 1272-1273.

Primary Examiner—John S. Heyman
Assistant Examiner—Larry N. Anagnos
Attorney, Agent, or Firm—Hill, Gross, Simpson, Van Santen, Steadman, Chiara & Simpson

[57] ABSTRACT

A circuit arrangement for the protection of inputs of integrated MOS circuits against excessive voltages, for example as a consequence of static charges, includes a first circuit means connected to the MOS circuit and having two bypass circuits reacting at different input voltage values and having a high-ohmic compensating resistance, and second circuit means is connected ahead of the first circuit and comprises a bypass circuit and a high-ohmic compensating resistance.

2 Claims, 1 Drawing Figure

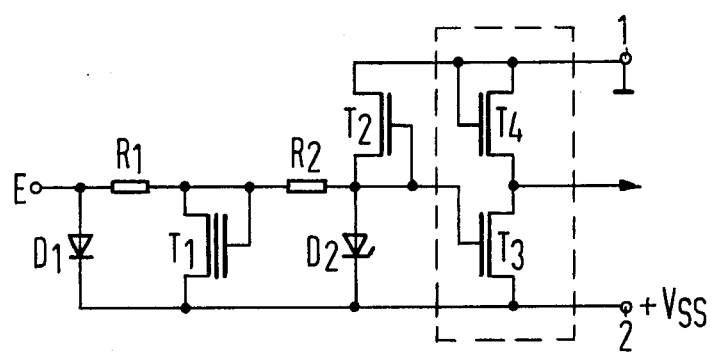

CIRCUIT ARRANGEMENT FOR THE PROTECTION OF INPUTS OF INTEGRATED MOS CIRCUITS

BACKGROUND OF THE INVENTION

1. Field of the Invention

The present invention relates to a circuit arrangement for the protection of inputs of integrated MOS circuits against excessive voltages which may occur, for example, as a consequence of static charges.

2. Description of the Prior Art

In integrated MOS circuits, voltages having magnitudes in the kV range can arise at the inputs thereof as a result of static charges. These high voltages lead to a destruction of the oxide of the circuits, for example of the gate oxide of the input transistors. The breakdown voltages in this connection are in the order of magnitude of 60 V.

It is known, in principle, to provide bypass circuits at the inputs of integrated MOS circuits in order to avoid destructions which may result as a consequence of excessively high voltages.

SUMMARY OF THE INVENTION

The primary object of the present invention is to improve destruction security, i.e. to create a circuit arrangement which still offers safety even with voltages of several kV at the inputs of integrated MOS circuits.

The above object is achieved in a circuit arrangement of the type described by the following features.

First circuit means, connected with the MOS circuit, have two bypass circuits which react at different input voltage values and has a high-ohmic compensating resistance. Second circuit means, connected ahead of the first circuit means, have a bypass circuit and a high-ohmic compensating resistance.

In a particular embodiment of the invention, the bypass circuits of the first circuit means include an MOS transistor and a gate-controlled pn diode.

According to a further development of the invention, the bypass circuit of the second circuit means includes a thick-oxide MOS transistor.

According to a further feature of the invention, a pn bypass diode is connected ahead of the second bypass circuit.

BRIEF DESCRIPTION OF THE DRAWING

Other objects, features and advantages of the invention will become apparent from the following detailed description, taken in conjunction with the accompanying drawing on which there is a single FIGURE which schematically illustrates the input of an integrated MOS circuit and a protective circuit constructed in accordance with the present invention.

DESCRIPTION OF THE PREFERRED EMBODIMENTS

Referring to the drawing, an input circuit of an integrated MOS circuit, enclosed by broken lines, is formed of two MOS transistors T3 and T4. This circuit defines an inverter stage having the transistor T3 as an input transistor and the transistor T4, as a load, connected as a load resistance for the transistor T3. The supply voltage is fed in at the terminals 1 and 2, the terminal 1 being connected to a reference voltage, here ground, and the terminal 2 being connected to a positive potential $+V_{ss}$. First circuit means are connected to the input of the MOS circuit and comprise two bypass circuits which are provided by the transistor T2 and the diode D2, as well as a high-ohmic compensating resistor R2. One of the bypass circuits formed by an MOS transistor T2 which is connected with its source-drain path extended between the gate of the transistor T3 and ground, and its gate connected to the input of the transistor T3 in common with the junction between the transistor T2 and the diode D2. The second bypass circuit is formed by a gate-controlled pn diode D2 which is connected between the gate of the transistor T3 and the terminal 2.

Ahead of the circuit just-described, second circuit means are connected, which are formed by an MOS transistor T1 and a high-ohmic compensating resistor R1. The transistor T1 connected in the bypass circuit is preferably a thick-oxide MOS transistor.

Finally, connected between an input E and the terminal 2 is a pn arrester diode D1.

In the operation of the circuit described above, if a negative excessive voltage occurs at the input E, then a voltage division exists between the high-ohmic compensating resistances R1 and R2. If the voltage at the junction of the resistances R1 and R2 exceeds the threshold potential of the transistor T1, which can amount to, for example, about 35 V, then the transistor T1 begins to conduct. The transistor T1 then represents a low-ohmic bypass circuit for the input of the transistor T3.

If the voltage behind the resistance R2 is also above the threshold voltage of the transistor T2, or, respectively, above the breakdown voltage (for example, about 35 V) of the diode D2, then these elements also form bypass circuits for the input of the transistor T3.

Altogether there results for the protective circuit arrangement described above, a destruction safety for the input of the transistor T3 of 4 to 4.5 kV.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A protection circuit for protecting an input of an integrated MOS circuit against excessive voltages, the integrated MOS circuit connected across first and second supply terminals, comprising:
   an input;
   a pn bypass diode connected between said input and the first supply terminal;
   a first MOS transistor including a source-drain path connected between the second supply terminal and an input of said MOS circuit and a gate connected to said input of said MOS circuit;
   a gate controlled pn diode connected between said input of said MOS circuit and the first supply terminal;
   a first resistor connected with a first terminal to said input of said MOS circuit;
   a second MOS transistor including a source-drain path connected between a second terminal of said first resistor and said first supply terminal and a gate connected to said second terminal of said first resistor; and
   a second resistor connected between said second terminal of said first resistor and said input.

2. The protection circuit of claim 1, wherein said second MOS transistor comprises a thick-oxide MOS transistor.

* * * * *